(12) United States Patent
Vinokur et al.

(10) Patent No.: US 8,763,174 B2
(45) Date of Patent: *Jul. 1, 2014

(54) SOAKING BASIN HAVING DISPOSABLE LINER AND SUPPORT FRAME

(71) Applicant: Footsiebath LLC, Beverly Hills, CA (US)

(72) Inventors: Genya Vinokur, Los Angeles, CA (US); Sasha Vinkur, Los Angeles, CA (US); Michael Vinokur, Los Angeles, CA (US)

(73) Assignee: Footsiebath, LLC, Beverly Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/778,101

(22) Filed: Feb. 26, 2013

(65) Prior Publication Data

US 2013/0167295 A1    Jul. 4, 2013

Related U.S. Application Data

(63) Continuation of application No. 12/102,206, filed on Apr. 14, 2008, now Pat. No. 8,387,175, which is a continuation-in-part of application No. 11/382,548, filed on Oct. 5, 2006, now Pat. No. 7,895,685.

(51) Int. Cl.
*A47K 3/022*    (2006.01)

(52) U.S. Cl.
USPC ............... 4/622; 4/621; 4/583; 4/655; 4/580; 4/DIG. 18; 601/156; 601/157

(58) Field of Classification Search
USPC ............... 4/662, 621, 541.1, 541.5, 665, 680, 4/681, 583, DIG. 18
See application file for complete search history.

(56) References Cited

U.S. PATENT DOCUMENTS 5,886,323 A * 3/1999 Hivale ........................... 219/497
6,886,191 B2 * 5/2005 Zolotnik ........................... 4/622

\* cited by examiner

*Primary Examiner* — Gregory Huson
*Assistant Examiner* — Lauren Heitzer
(74) *Attorney, Agent, or Firm* — Tsircou Law, PC

(57) ABSTRACT

A soaking basin is provided having a base unit, a disposable liner, and a frame nested therebetween to enable removal of the liner from the base unit, even when filled with liquid. In this manner, a user can remove the liner filled with liquid to pour out the liquid and discard the liner, after a treatment has been completed. Thus, the user need not lift the entire soaking basin to pour out liquid. In addition, the user can use the frame to support the new liner while filling it with liquid, and to transport the filled liner to the base unit to service clients.

20 Claims, 2 Drawing Sheets

SOAKING BASIN HAVING DISPOSABLE LINER AND SUPPORT FRAME

CROSS REFERENCE TO RELATED APPLICATION

This application is a continuation of U.S. application Ser. No. 12/102,206, filed Apr. 14, 2008, which a continuation in part of U.S. application Ser. No. 11/382,548, filed Mar. 10, 2006, which are herein incorporated by reference.

FIELD OF THE INVENTION

The present invention relates generally to soaking basins and, more particularly, to a soaking basin having a disposable liner.

BACKGROUND OF THE INVENTION

While receiving a pedicure or a manicure at beauty salons, clients customarily have their hand and feet soaked in a basin of warm liquid. Soaking softens the skin and nails and has many other therapeutic benefits to include stimulating circulation of the blood and otherwise alleviating fatigue. Consequently, soaking is a particularly enjoyable part of having a manicure or pedicure.

In a salon setting, a soaking basin can be used by dozens of clients in a single day. So, hygienic practices regarding use of the basins are an important consideration. It is common and often required, that the basin is emptied and cleaned between uses. However, such repeated cleaning can reduce the life of the basin and can be time consuming. Instead, to cut down on repeated cleanings and yet to promote hygiene, many salons use makeshift liners such as plastic sacks, particularly those commonly used for groceries. Although generally effective, such plastic sacks lack sufficient rigidity to remain in place. Thus, leaking can be problem and, even if properly secured, wet sacks can feel odd against the client's skin. In addition, use of plastic bags lack esthetic appeal.

In current approaches, it is typically required that the technician lift the entire soaking basin filled with liquid to discard the liquid in between uses. Many such soaking basins include electrical components such as heating, vibration, and air circulation systems, adding to the weight of the soaking basin. Thus, such basins can be relatively heavy and awkward to lift.

It should, therefore, be appreciated that there exists a need for a soaking basin having a disposable liner that provides a therapeutic soak and is cost-effective to manufacture. The present invention fulfills this need and others.

SUMMARY OF THE INVENTION

Briefly, and in general terms, a soaking basin is provided having a base unit, a disposable liner, and a frame nested between the base unit and the disposable liner. The frame enables easy removal of the liner from the base unit, even when filled with liquid. In this manner, a user can remove the liner filled with liquid to pour out the liquid and discard the liner, after a treatment has been completed. Moreover, the basin is cost-effective to manufacture and use.

More specifically, in an exemplary embodiment, the base unit includes a base housing and a peripheral wall projecting upwardly therefrom, which combine to define a basin cavity for receiving the disposable liner. The liner is configured to nest with the basin cavity. The base unit provides structural support to the soaking basin, allowing the liner to be particularly thin, e.g., 0.03-0.50 mm, without sacrificing the stability of the basin.

In a detailed aspect of an exemplary embodiment, the frame includes a lip support disposed adjacent to the lip of the liner, a pair of handles coupled to the lip support and configured to extend beyond the periphery of the peripheral wall of the base unit when the frame is nested therein, a base support coupled to the lip support and disposed below the floor of the liner, and a side support coupled between the lip support and the base support.

In another detailed aspect of an exemplary embodiment, the lip support circumscribes the lip of the frame. The lip of the liner can further define a spout disposed between the handle of the frame to facilitate disposal of liquid within the liner.

In yet another detailed aspect of an exemplary embodiment, both the base unit and the liner define an elongate protrusion that nest together. The base support defines an opening to enable an elongate protrusion of the base unit to extend therebetween.

For purposes of summarizing the invention and the advantages achieved over the prior art, certain advantages of the invention have been described herein. Of course, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment disclosed.

BRIEF DESCRIPTION OF THE DRAWINGS

Embodiments of the present invention will now be described, by way of example only, with reference to the following drawings in which.

DETAILED DESCRIPTION OF THE PREFERRED EMBODIMENTS

Figure 1:
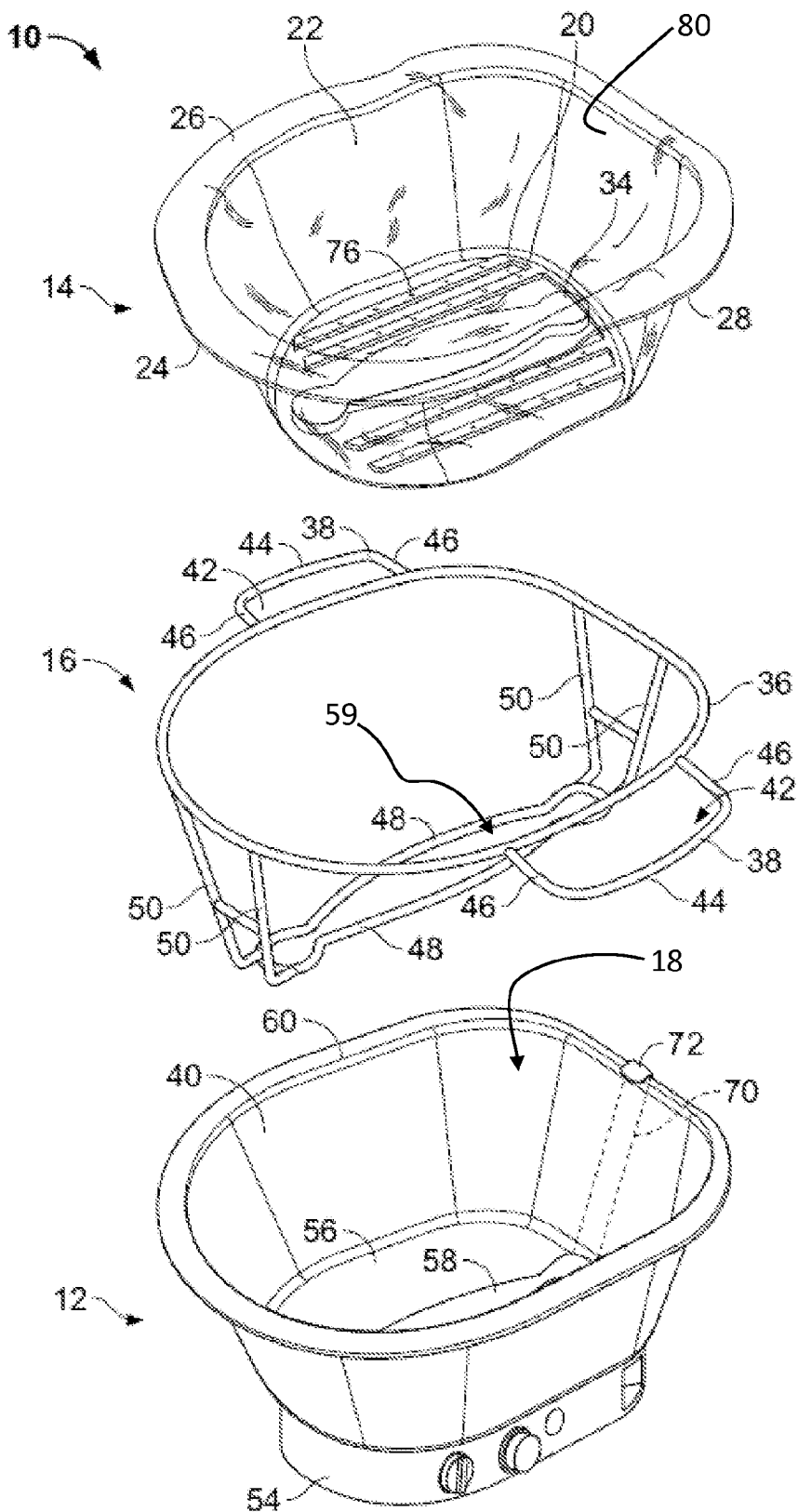
FIG. 1 is exploded perspective view of a soaking basin having a base unit, a frame, and a disposable liner in accordance with the invention.

Referring now to the drawings, and particularly FIG. 1, there is shown a soaking basin 10 having a base unit 12, a disposable liner 14, and a support frame 16 nested between the base unit and the liner. The frame enables ease removal of the liner from the base unit, even when filled with liquid. In this manner, a user can remove the liner filled with liquid to pour out the liquid and discard the liner, after a treatment has been completed. Thus, the user need not lift the entire soaking basin to pour out liquid. In addition, the user can use the frame to support a new liner while filling it with liquid, and to transport the filled liner to the base unit to service clients.

Figure 2:
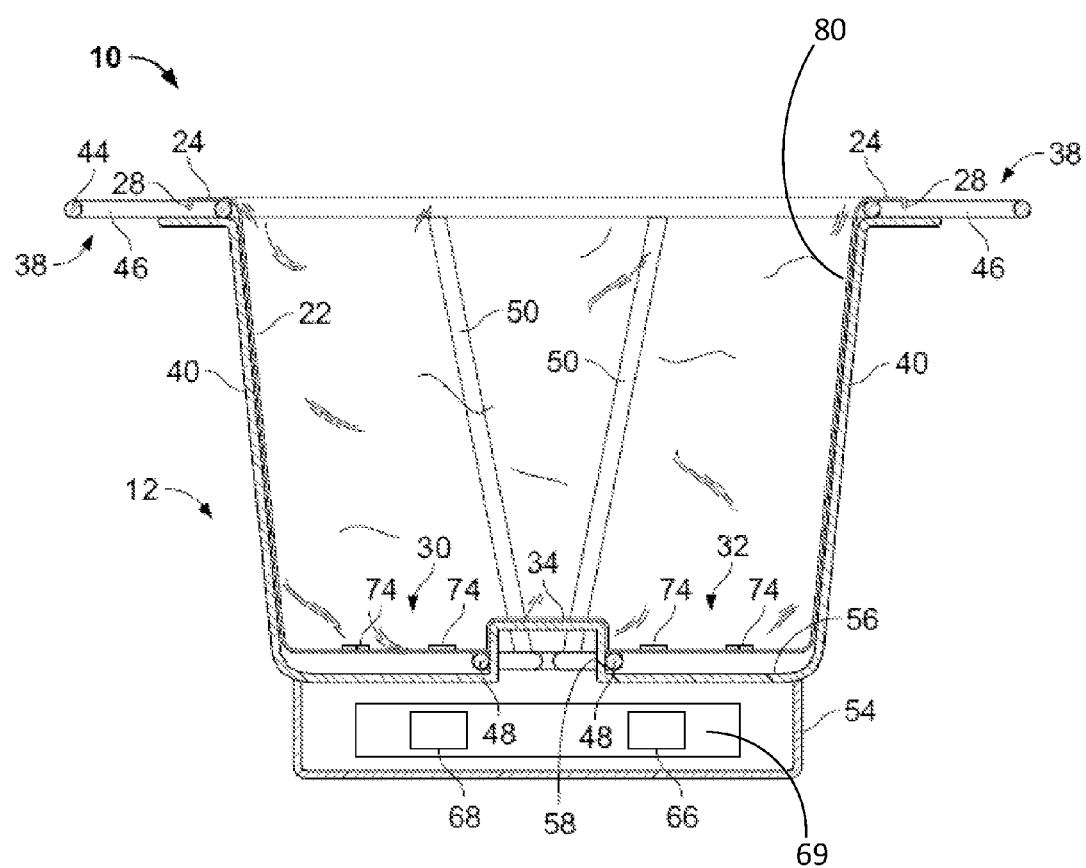
FIG. 2 is a cross-sectional view of the soaking basin of FIG. 1, depicting the frame and liner nested within the soaking basin.

With reference to FIG. 2, the disposable liner 14 has a pre-formed shape closing conforming to nest within a basin cavity 18 defined by the base unit 12. The disposable liner includes a floor 20 and a peripheral wall 22, circumscribing the floor. The peripheral wall terminates with a lip 24 disposed about the periphery of an upper end 26 of the liner. The lip is generally horizontally oriented. The lip further includes a downward extending portion 28 disposed outside the frame 16, to aid in supporting the liner within the bounds of the frame while transporting the liner filled with liquid.

The floor 20 of the liner 14 defines foot areas 30 and 32 positioned on opposite sides of an elongate protrusion 34. The areas are shaped to comfortably accommodate a typical user's left foot and right foot. Since the liner 14 is intended to be disposed after use, material cost for the liner is an important consideration. The liner is formed of liquid impermeable material such as plastic, e.g., polycarbonate or PET plastic. In the exemplary embodiment, the base unit is configured to provide structural support to the soaking basin, allowing the liner to be particularly thin, e.g., 0.03-0.50 mm, without sacrificing stability. In the exemplary embodiment the liner is about 0.30 mm.

The frame 16 includes a lip support 36 that circumscribes the upper portion 26 of the liner 14 adjacent to the lip 24 of the liner to support the liner. The frame further includes a pair of handles 38 coupled to the lip support. The handles extend beyond the periphery of a peripheral wall 40 of the base unit 12 when the frame is nested therein. The handles are generally u-shaped and are sized to allow a user insert their fingers through an opening 42 defined by the handle to grasp an intermediate portion 44 of the handle. The handles are attached to the lip support by spaced-apart portions 46.

The frame 16 further includes two base supports 48 disposed below and in contact with the floor of the liner, to aid in supporting the liner in transport. Each base support is coupled the lip support of the frame by two side supports 50 on opposing ends of the base support. In the exemplary embodiment, the side supports and corresponding base support are formed of a single metal wire formed in the prescribed shape. Other embodiments for the frame can implement various other combinations of support members and components, so long as sufficient structural stability is provided for the liner.

In the exemplary embodiment, the frame 16 is formed of metal wire, providing stable support for the frame during transport; however, other materials, e.g., plastic, composite material and so on, can be used to in other embodiment that can provide sufficient structural stability for its intended purpose. The metal wire for the frame is formed of stainless steel, having a diameter of about 20 mils.

With reference again to FIG. 1, the base unit 12 includes a base housing 54 and the peripheral wall 40 projecting upwardly therefrom, defining the basin cavity 18 for receiving the disposable liner and the support frame. The base unit 12 includes electronic components to provide heat, agitation, and/or air bubbles, as disclosed in applicant's co-pending U.S. application Ser. No. 11/382,548, filed Mar. 10, 2006.

Stability of the soaking basin during use is an important design consideration. More particularly, the base unit is configured to enable the liner and the frame to nest within the basin cavity in a stable manner, particularly during use. The basin cavity is further defined by a basin floor 56. The basin floor includes raised portions sized and positioned to support the floor of the disposable liner when nested in the basin cavity with the frame 16 disposed therebetween. The frame defines a plurality of voids (e.g., opening 59) throughout such that the frame is incapable of holding the soaking solution apart from the disposable liner, such as opening 59 conformingly sized to receive an elongate protrusion 58 of the liner. The base supports 48 of the frame are disposed on opposing sides of the elongate protrusions. In addition, an upper edge 60 of the peripheral wall 40 of the base unit 12 defines a pair of recesses 62 to receive the handles 38 of the frame.

In the exemplary embodiment, the base unit is of unitary construction, including the peripheral wall integrally attached to the base compartment, further to facilitate stable support for the soaking basin while in use.

With reference to FIG. 2, the base unit 12 includes a heater 66 and a fan assembly 68 mounted within the base housing in compartment 69 and operatively connected to the liner. The heater is configured to heat the air generated by the fan assembly to prevent the air bubbles generated from unduly cooling the liquid held in the liner. The heater can also be configured to heat the liquid more directly, e.g., via heating elements disposed about base unit adjacent to the liner. In addition, other therapeutic systems such a vibration system can be incorporated into the base unit, as desired.

The base unit 12 defines an air conduit 70 extending from the base housing up the peripheral wall for connection to the liner 14 at an upper end 60 thereof. A stopper 72 is provided at the connection between the conduit and the liner to maintain an airtight seal. In the exemplary embodiment, the conduit extends above the upper end of the liner. In other words, the conduit extends above the waterline even when the liner is fully filled, thereby inhibiting liquid from traveling down the conduit without requiring any sort of liquid inhibitor, e.g., one-way valves, along the air path. In other embodiments, a liquid inhibiter can be provided. For example, the conduit and the connection point could reside below the maximum waterline of the liner, while having an inhibitor disposed along the air path, in which the inhibitor is configured to prevent liquid from passing while allowing air generated by the fan to proceed past.

The liner 14 defines an air chamber that extends down the peripheral wall 22 and into both foot areas 30, 32. More particularly, the air chamber splits into several branches 74 defined in the floor of the liner in both foot areas. Apertures 76 are spaced along the branches. In the exemplary embodiment, two parallel branches are in each foot area, generally aligned with the corresponding foot such that the resulting bubble will hit the sole of the foot. In other embodiments, the air chamber can be arranged in various different configurations and locations, for example, to achieve different bubble patterns. The floor of the liner further defines a plurality of bumps 78 in both foot areas. The bumps are positioned to provide points of contact against the soles of a user's feet.

In an exemplary embodiment, a water-soluble coating 80 can be disposed on an interior surface of the liner 14. For example, the coating can include a combination of soap and skin softener that dissolves when liquid is held in the liner. In this manner, prescribed proportions of additives in the soaking liquid of the basin can be ensured for optimized therapeutic treatment. In an exemplary method of manufacturing, a preformed liner is sprayed with a prescribed solution having desired additives, e.g., soap and skin softener. The sprayed liner is then heated, causing the solution to dehydrate and adhere to the liner. For example, the sprayed liner can be heated at about 135 degrees until the solution sufficiently adheres.

It should be appreciated from the foregoing that the present invention provides a soaking basin having a base unit, a disposable liner, and a support frame nested between the base unit and the liner. The frame enables ease removal of the liner from the base unit, even when filled with liquid. In this manner, a user can remove the liner filled with liquid to pour out the liquid and discard the liner, after a treatment has been completed. Thus, the user need not lift the entire soaking basin to pour out liquid. In addition, the user can use the frame to support a new liner while filling it with liquid, and to transport the filled liner to the base unit to service clients.

The present invention has been described above in terms of presently preferred embodiments so that an understanding of the present invention can be conveyed. However, there are other embodiments not specifically described herein for which the present invention is applicable. Therefore, the present invention should not to be seen as limited to the forms shown, which is to be considered illustrative rather than restrictive.

What is claimed is:

1. A soaking basin, comprising:
    a base unit having a base housing and a peripheral wall projecting upwardly from the base housing to define a basin cavity, the base housing defining a component compartment; and
    a frame sized to be nested between the base unit and a disposable liner, the disposable liner preformed and sized to nest within the basin cavity and configured to hold a soaking solution, the liner including a floor and a lip disposed about the periphery of an upper end of the liner, the frame comprising a plurality of interconnected elongated supports that define a plurality of voids between the interconnected elongated supports such that the frame is incapable of holding the soaking solution apart from the disposable liner.

2. A soaking basin as defined in claim 1, wherein, the frame includes a lip support disposed adjacent to the lip of the liner.

3. A soaking basin as defined in claim 2, wherein the frame includes a pair of handles coupled to the lip support and configured to extend beyond the periphery of the peripheral wall of the base unit when the frame is nested therein.

4. A soaking basin as defined in claim 2, wherein the frame includes a base support coupled to the lip support and disposed below the floor of the liner.

5. A soaking basin as defined in claim 1, wherein the base floor of the base unit includes raised portions sized and positioned to support the floor of the disposable liner when nested in the basin cavity with the frame disposed therebetween.

6. A soaking basin as defined in claim 1, wherein the frame includes side supports extending between the lip support and the base support.

7. A soaking basin as defined in claim 1, wherein the base unit is of unitary construction, including the peripheral wall integrally attached to the base compartment.

8. A soaking basin as defined in claim 1, wherein the frame is formed of metal, plastic, or composite material.

9. A soaking basin, comprising:
    a base unit having a base portion and a peripheral wall extending upward from the base portion defining a basin cavity, the base portion having a component compartment;
    a disposable liner preformed and sized to nest within the basin cavity and configured to hold a soaking solution, the liner including a floor and a lip disposed about the periphery of an upper end of the liner; and
    a frame configured to be nested between the base unit and the disposable liner, the frame including a lip support disposed adjacent to the lip of the liner, a pair of handles coupled to the lip support and configured to extend beyond the periphery of the peripheral wall of the base unit when the frame is nested therein, and a base support coupled to the lip support and disposed below the floor of the liner, the frame comprising a plurality of interconnected elongated supports that define a plurality of voids between the interconnected elongated supports such that the frame is incapable of holding the soaking solution apart from the disposable liner.

10. A soaking basin as defined in claim 9, wherein the base unit is of unitary construction, including the peripheral wall integrally attached to the base compartment.

11. A soaking basin as defined in claim 9, wherein the frame is formed of wire.

12. A soaking basin as defined in claim 11, wherein the frame is formed of metal, plastic, or composite material.

13. A soaking basin as defined in claim 9, wherein a void of plurality of voids is defined by the base support.

14. A soaking basin, comprising:
    a base unit having a base housing and a peripheral wall projecting upwardly from the base housing to define a basin cavity; and
    a frame sized to be nested between the base unit and a disposable liner, the disposable liner preformed and sized to nest within the basin cavity and configured to hold a soaking solution, the liner including a floor and a lip disposed about the periphery of an upper end of the liner, the frame comprising a plurality of interconnected elongated supports that define a plurality of voids between the interconnected elongated supports such that the frame is incapable of holding the soaking solution apart from the disposable liner.

15. A soaking basin as defined in claim 14, wherein the plurality of interconnected elongated supports of the frame includes:
    a lip support that defines an upper peripheral edge of the frame disposed adjacent to the lip of the liner; and
    a pair of elongated base supports that extends from the lip support and disposed below the floor of the liner;
    wherein the lip support and the base support aid in defining voids of the plurality of voids.

16. A soaking basin as defined in claim 14, wherein the frame is formed of wire.

17. A soaking basin as defined in claim 16, wherein the frame is formed of metal, plastic, or composite material.

18. A soaking basin as defined in claim 14, wherein the plurality of voids are defined along a base and a side of the frame.

19. A soaking basin as defined in claim 1, wherein the plurality of voids are defined along a base and a side of the frame.

20. A soaking basin as defined in claim 9, wherein the plurality of voids are defined along a base and a side of the frame.

* * * * *